(12) United States Patent
James-Roxby et al.

(10) Patent No.: US 7,139,995 B1
(45) Date of Patent: Nov. 21, 2006

(54) INTEGRATION OF A RUN-TIME PARAMETERIZABLE CORE WITH A STATIC CIRCUIT DESIGN

(75) Inventors: Philip B. James-Roxby, Longmont, CO (US); Daniel J. Downs, Longmont, CO (US); Russell J. Morgan, Longmont, CO (US); Cameron D. Patterson, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 600 days.

(21) Appl. No.: 10/102,585

(22) Filed: Mar. 19, 2002

(51) Int. Cl.
*G06F 17/50* (2006.01)
*H03K 19/173* (2006.01)

(52) U.S. Cl. ............................ 716/16; 716/1; 716/12; 716/14; 716/17; 326/38; 326/39; 326/40

(58) Field of Classification Search .................... 716/1, 716/3, 12, 14, 16, 17; 711/153; 710/5; 326/38, 326/39, 40
See application file for complete search history.

(56) References Cited

U.S. PATENT DOCUMENTS

| | | | |
|---|---|---|---|
| 6,216,258 B1 * | 4/2001 | Mohan et al. ................. | 716/17 |
| 6,279,045 B1 * | 8/2001 | Muthujumaraswathy et al. | 710/5 |
| 6,311,316 B1 * | 10/2001 | Huggins et al. ............... | 716/12 |
| 6,401,230 B1 * | 6/2002 | Ahanessians et al. .......... | 716/1 |
| 6,487,709 B1 * | 11/2002 | Keller et al. .................. | 716/14 |
| 6,510,546 B1 * | 1/2003 | Blodget ......................... | 716/16 |
| 6,530,071 B1 * | 3/2003 | Guccione et al. ............. | 716/17 |
| 6,668,237 B1 * | 12/2003 | Guccione et al. ........... | 702/119 |
| 6,725,441 B1 * | 4/2004 | Keller et al. .................. | 716/16 |

OTHER PUBLICATIONS

Press Release from Altera Corporation, Altera's Mega Wizard Plug-Ins Offer the First Too-Independent Parameterized Logic Cores, Feb. 2, 1998.*
Roxby et al., "Automated extraction of run-time parameterisable cores from programmable device configurations", Apr. 2000, Field-Programmable custom computing machines, 2000 IEEE Symposium, pp. 153-161.*
Peter Bellows, Brad Hutchings; "JHDL—An HDL for Reconfigurable Systems"; Proceedings of IEEE Symposium on Field-Programmable Custom Computing Machines; Apr. 1998; 10 pages.
Philip B. James-Roxby, Daniel J. Downs; "Cores and Anti-cores: Using JBits as Part of a Mainstream Design Fow"; Proceedings of 8th Reconfigurable Architectures Workshop; Apr. 27, 2001; 6 pages.

* cited by examiner

*Primary Examiner*—A. M. Thompson
*Assistant Examiner*—Helen Rossoshek
(74) *Attorney, Agent, or Firm*—LeRoy D. Maunu

(57) ABSTRACT

Method and apparatus for integrating a run-time parameterizable logic core with a static circuit design. A configuration bitstream is generated from a main circuit design that is specified in a hardware description language. The main circuit design includes a first sub-circuit design that specifies a selected subset of resources of the PLD needed by the RTP core and an interface between the RTP core and other parts of the main circuit design. Via execution of a run-time reconfiguration control program, the configuration data that correspond to the first sub-circuit design are replaced with configuration data that implement the RTP core. The run-time reconfiguration program then configures the PLD with the updated configuration bitstream.

14 Claims, 3 Drawing Sheets

INTEGRATION OF A RUN-TIME PARAMETERIZABLE CORE WITH A STATIC CIRCUIT DESIGN

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to creating circuit designs, and more particularly to integrating a run-time parameterizable core with a static circuit design.

BACKGROUND

Logic cores are generally used as building blocks in creating electronic circuit designs. A logic core is a design that when implemented in hardware performs a predetermined function and which has input and output signal lines that can be connected to other logic. Example logic cores include digital filters and multipliers.

The traditional tools for creating logic cores generally support design entry via schematics or a hardware description language such as Verilog or VHDL. In addition, there are a multitude of proprietary languages for creating logic cores that are specifically suitable for a particular family of devices. These types of designs are sometimes termed "static" designs because once a device is configured and power is applied, the circuit remains the same until power is removed.

Circuit designs, including run-time parameterizable (RTP) logic core generators, can be created in the JBits™ environment from Xilinx. The JBits environment is a Java-based tool that includes an application programming interface (API) that allows designers to develop logic and write a configuration bitstream directly to a Xilinx FPGA. The JBits API permits the FPGA bitstream to be modified quickly, allowing for fast reconfiguration of the FPGA. In a run-time reconfiguration system, circuits are configured and then reconfigured based on information supplied in real-time by user software, user data, or sensor data. With Virtex™ FPGAs, the JBits API can be used to partially or fully reconfigure the internal logic of the hardware device. The JBits environment also supports run-time reconfiguration of FPGAs and also configuration of FPGAs over a communications network, for example, an intranet or the Internet.

Run-time reconfigurable systems are generally co-processor systems. A host processor executes a run-time reconfiguration program, and the run-time reconfiguration program implements application functions on the host processor, defines a circuit design, creates configuration data, and configures the FPGA.

The different design flows for static versus run-time reconfigurable designs has limited the extent to which RTP cores are used in conjunction with static designs. Without a way to easily combine static and RTP cores, designers are left to create designs in one form or the other. Thus, designers may be left to choose between the many static-design logic cores that are commercially available and the benefits of run-time parameterizable logic cores.

A system and method that address the aforementioned problems, as well as other related problems, are therefore desirable.

SUMMARY OF THE INVENTION

In various embodiments, the invention provides a method and apparatus for integrating a run-time parameterizable logic core with a static circuit design. A configuration bitstream is generated from a main circuit design that is specified in a hardware description language. The main circuit design includes a sub-circuit design that uses a selected subset of resources of the PLD. Via execution of a run-time reconfiguration control program, the data that correspond to the sub-circuit design are replaced with configuration data that implement a function defined by the run-time reconfiguration control program. The PLD is then configured with the configuration bitstream after replacement of the selected data.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
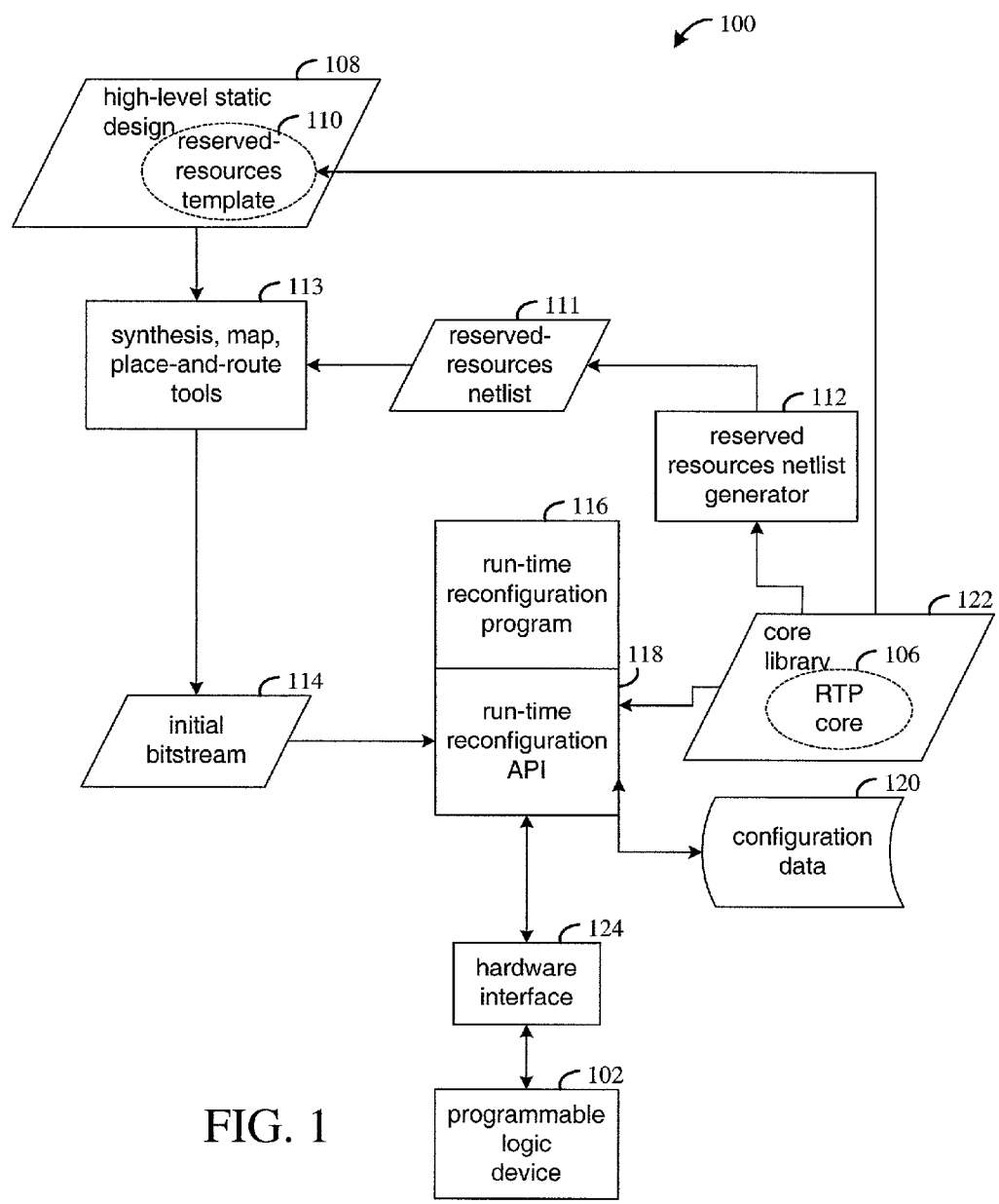
FIG. 1 is a functional block diagram of a system for implementing an electronic circuit design in accordance with an example embodiment of the invention.

FIG. 1 is a functional block diagram of system for implementing an electronic circuit design in accordance with an example embodiment of the invention. System 100 supports integration of a run-time parameterizable (RTP) logic core with a static circuit design and includes a collection of software tools and hardware components that together are used to implement a design for a programmable logic device (PLD) 102. The software tools are hosted by a data processing system (not shown), for example, a workstation, or multiple networked systems.

Integration of an RTP core 106 with a high-level static circuit design 108 involves including a reserved-resources template 110 in the static design (e.g., HDL or schematic capture). The reserved-resources template reserves the PLD resources that are used by, and defines the interface for the RTP core to be implemented later in the process. Through analysis of the RTP core definition, the resources that are used by the RTP core are determined, and a reserved-resources netlist 111 is generated by reserved resource netlist generator 112.

Generator 112 initially examines the interface of the RTP core and generates a number of components, each of which implements one part of the interface. Together, the components implement the whole of the interface. Then a further series of components are generated between the interface components. These additional components reserve space on the device and reserve some routing resources.

In one embodiment, the reserved-resources template is an HDL "component" that has the same interface as the netlist 111. The component in the template 110 has the same name as the top level component in the netlist 111. The component is treated as a black-box during synthesis. When the circuit is implemented, the software is directed to the location of the netlist 111 to create the configuration data for the PLD to reserve the resources. By producing a netlist 111 that is separate from the template 110 and that is in a standard netlist format, the netlist can be used in a variety of present and future environments.

The static design 108 is then passed through implementation tools 113. Tools 113 perform the functions of synthesis, device mapping, and place-and-route functions. The output data from tools 113 is an initial bitstream 114.

The initial bitstream is read by run-time reconfiguration program 116 via run-time reconfiguration API 118. In one embodiment, the run-time reconfiguration API is the JBits Software Development Kit from Xilinx. Data from the initial bitstream are formatted and stored as configuration data 120.

Runtime reconfiguration program 116 then removes the reserved-resources template and the associated internal signal paths. RTP core 106 is then called via API 118 to implement the functions of the RTP core. RTP core 106 replaces the portions of configuration data 120 that were reserved by the reserved-resources template 110 with data that implement the functions of the RTP core 106. In one embodiment, RTP core 106 is part of a core library 122.

At a time determined by the run-time reconfiguration program, the PLD 102 is configured with configuration data via hardware interface 124. Hardware interface 124 includes a portable layer of software and accompanying hardware to couple the run-time reconfiguration program to PLD 102. An example hardware interface 124 is the Xilinx Hardware Interface (XHWIF) which is available from Xilinx.

Figure 2:
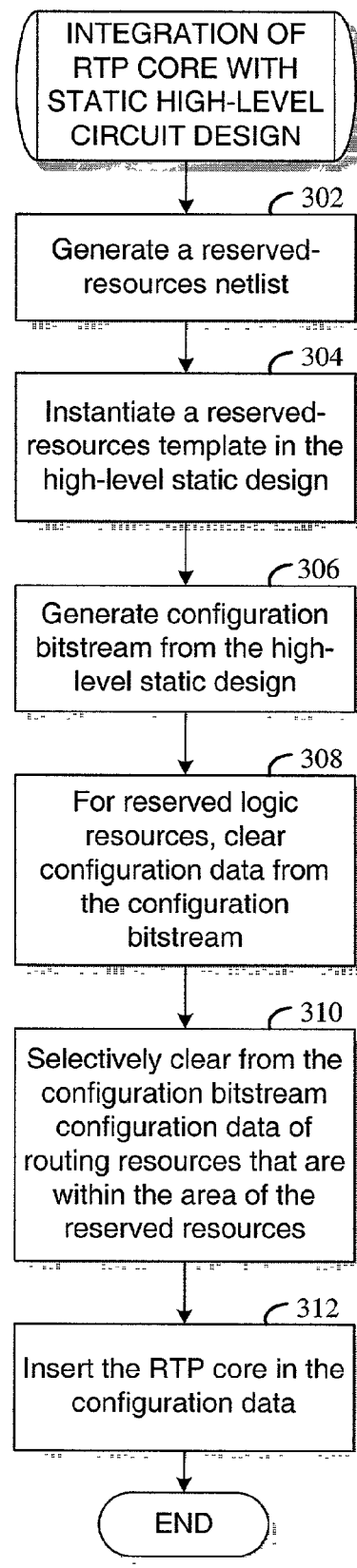
FIG. 2 is a flowchart of a process for integration of a run-time parameterizable core with a static high-level circuit design.

FIG. 2 is a flowchart of a process for integration of a run-time parameterizable core with a static high-level circuit design. The first stage in the process is to generate a reserved-resources netlist (step 302). The reserved-resources netlist acts as a placeholder for the PLD resources required by the RTP core and the interface with other parts of the circuitry.

In a specific application of the invention, the reserved-resources netlist defines a rectangular array of interconnected PLD resources. For example, the Virtex field programmable gate array (FPGA) from Xilinx has look-up tables (LUTS) that are configurable as shift registers. The shift register configuration consumes resources such that additional logic can not be implemented in the slice of the LUT (a "slice" includes two LUTs along with additional configurable resources of a Virtex FPGA, e.g., flip-flops).

For correct implementation of the interface to the RTP core, the reserved-resources netlist duplicates the interface to the RTP core. The same tool that determines the RTP core footprint also determines which physical pins are required by the RTP core and specifies these pins in the reserved-resources netlist.

Three issues arise in generating the reserved-resources netlist for the Virtex FPGA. The first issue relates to the way in which the Xilinx implementation tools assign address pins to the lookup tables, the second issue relates to the inability to constrain logic elements (e.g., a shift register) to a particular area of a Virtex slice through Xilinx implementation tools, and the third issue relates to trimming of logic by the implementation tools. With respect to the first issue, Xilinx implementation tools may swap address lines to LUTs and accordingly modify the initialization value. The behavior is addressed in one embodiment by configuring the LUT as a variable length shift register.

In regards to the inability to constrain logic elements to a particular area of a Virtex slice, an example is that while logic elements can be constrained to a particular slice there is no constraint available in the Xilinx implementation tools to constrain the logic elements to one of the two LUTs ("F-LUT" and "G-LUT") in a slice. This is addressed by identifying the asymmetry between the LUTS. For example, the F5 multiplexer is used to switch between the outputs of the F-LUT or the G-LUT based on a selection signal on the BX input port. Because the BX input signal also drives the data input to a shift register implemented on the F-LUT, the BX input signal cannot be inverted. Thus, by connecting the output ports of the shift registers implemented on the F-LUT and G-LUT to the F5 multiplexer, a lookup table can be constrained to a particular LUT within the slice.

The third issue of logic trimming that is performed by the implementation tools is addressed by observing the rules that are used by the implementation tools to determine which logic can be trimmed. In observing the rules, generator 112 does not generate logic in the reserved-resources netlist that would be susceptible to trimming.

After the reserved-resources netlist is created, a reserved-resources template is created for the static high-level circuit design (step 304). In an example embodiment, the template corresponds to the reserved-resources netlist. In a VHDL design, for example, the template includes a declaration of a component type in the VHDL architecture header and the instantiation of a component of the declared type in the VHDL architecture body. The VHDL code below sets forth the VHDL declaration of an example reserved-resources template.

```
COMP_TAG
component filter
port (
    clk : IN std_logic;
    sampleIn : IN std_logic_vector (7 downto 0);
    filtered : OUT std_logic_vector
        (19 downto 0));
end component;
```

The VHDL code below sets forth the VHDL instantiation of an example reserved-resources template.

```
INST_TAG
your_instance_name : filter
port map (
    clk => clk;
    sampleIn => sampleIn;
    filtered => filtered);
```

An initial configuration bitstream is created from the static high-level design (step 306) using selected implementation tools. It will be appreciated that prior to generating the initial bitstream, it may be desirable to simulate the design (including the RTP core). To simulate the RTP core in the design the run-time reconfiguration API is used to generate a netlist from the RTP core ("RTP-core netlist"). The RTP-core netlist is then instantiated in the HDL or schematic environment and the entire circuit is simulated. Once the designer is satisfied with the circuit behavior, the reserved-resources netlist is substituted for the RTP-core netlist and the initial configuration bitstream is generated.

The next phase of the process is to replace the configuration data corresponding to the reserved resources with configuration data to implement the RTP core. First, the configuration data for logic resources in the reserved area of the PLD are cleared by writing 0 bits to the configuration data (step 308). Next, the routing resources within the reserved area of the PLD are selectively cleared (step 310).

The routing resources that are cleared are those associated with the internal signal paths produced from the reserved-resources template. Paths that form the interface of the reserved-resources template to the rest of the design are not removed, and paths that pass through the reserved area and resulting from static logic outside the template may be selectively removed as explained below.

Because the configuration data for routing resources within the reserved area may be used by the circuitry implemented outside the reserved area, the configuration data for the routing resources cannot be cleared without first considering the implications. For example, changing a route might increase the delay of a signal path beyond that which is acceptable. There are three options for processing signal paths that are routed through the reserved area of the PLD. The first option is to leave the signal paths in the reserved area, the second option is to reroute all the paths around the reserved area, and the third option is to reroute selected paths around the reserved area.

Figure 3A:
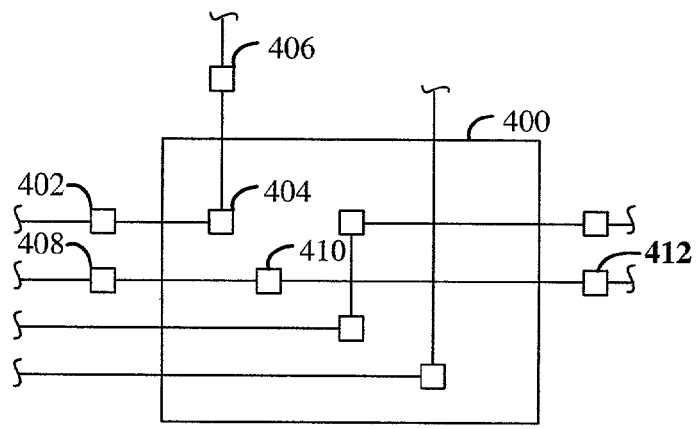
FIG. 3A illustrates a reserved area of a PLD in which routing resources within the reserved area are used for signal paths having sources and sinks (not shown) outside the reserved area.

FIG. 3A illustrates a reserved area 400 of a PLD in which routing resources within the reserved area are used for signal paths having sources and sinks (not shown) outside the reserved area. The blocks, for example 402, 404, 406 represent routing resources. Routing resources 402 and 406 are outside the reserved area and routing resource 404 is within the reserved area. The path from routing resource 408 via resource 410 to resource 412 is another path through the reserved area.

Leaving the paths routed through the reserved area may be feasible if there are sufficient routing resources within the reserved area to construct the RTP core. Therefore, whether all the paths are left in the reserved area will depend on the routing resource requirements of the RTP core within the reserved area and the routing requirements of the remaining circuitry (e.g., maximum delay).

Figure 3B:
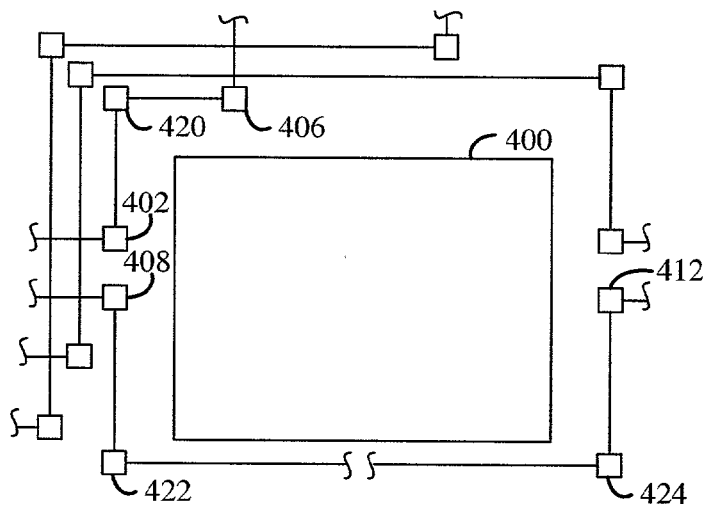
FIG. 3B illustrates a scenario in which all of the signal paths of FIG. 3A are rerouted around the reserved area.

FIG. 3B illustrates a scenario in which the signal paths of FIG. 3A are rerouted around the reserved area 400. For example, routing resource 402 is coupled to routing resource 406 via routing resource 420 instead of routing resource 404 (FIG. 3A). The path from routing resource 408 to routing resource 412 is rerouted through routing resources 422 and 424. If all paths are rerouted around the reserved area of the PLD, a trace utility provided by the run-time reconfiguration API 118 is useful. The trace utility returns the sources and corresponding sinks of the net. The net is then removed, and all the routing resources within the reserved area are marked as used. Then the original net is then rerouted using a routing utility provided by the run-time reconfiguration API. By marking the routing resources within the reserved area as being used, the routing utility avoids the used routing resources in constructing paths for the rest of the net.

Figure 3C:
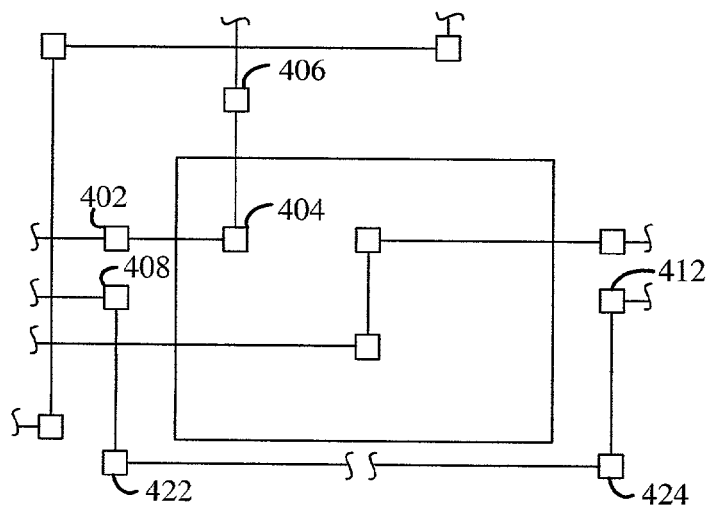
FIG. 3C illustrates a scenario in which some of the signal paths of FIG. 3A are rerouted around the reserved area.

FIG. 3C illustrates a scenario in which some of the signal paths of FIG. 3A are rerouted around the reserved area 400. For example, the path consisting of resources 402, 404, and 406 remains routed through the reserved area, and the path from resource 408 to 412 is rerouted via resources 422 and 424. If only some of the paths through the reserved area are selected for rerouting, only the selected paths are removed and all the routing resources in the reserved area are marked as used. The routing utility is applied to only those sources and sinks for which the paths were removed.

It will be appreciated that if all the parameters for the RTP core are known at design time, then it is desirable to route the RTP core at design time. For example, the JRoute utility in the run-time reconfiguration API 118 produces paths at design time in terms of the settings of the routing resources that define the paths. This saves routing paths at run-time.

Returning now to FIG. 2, the final phase of integrating the RTP core with the static design is inserting the configuration data for the RTP core in the configuration data (FIG. 1, 120). If run-time parameterization of the RTP core is not required and the RTP core has been routed at design time, the core is invoked to write the RTP core configuration data to the configuration data for the entire circuit. Because the routes from the other parts of the circuit to the RTP core part of the circuit were established when the reserved-resource netlist was merged with the design, these routes remain and provide the paths for communication between the RTP core and the rest of the circuit.

If parameterization of the RTP core is required, then the RTP core is inserted when the parameters are known. The run-time reconfiguration API is used to determine the routing resources that are in use within the reserved area, and these routing resources are marked as used. The RTP core is called with the run-time parameters, and the routing tool constructs signal paths without interfering with the rest of the design.

Various embodiments of the present invention have been described in terms of FPGAs and the JBits environment from Xilinx. Those skilled in the art will appreciate, however, that the invention could be applied to programmable logic devices (PLDs) other than FPGAs and implemented in other run-time reconfiguration environments. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for implementing a circuit on a programmable logic device (PLD), from a circuit design defined by a high-level static circuit design and a run-time parameterizable (RTP) core, comprising:

generating a configuration bitstream from a main circuit design specified in a hardware description language and including a first sub-circuit design that specifies a selected subset of resources of the PLD needed by the RTP core and an interface between the RTP core and other parts of the main circuit design;

replacing in the configuration bitstream configuration data that correspond to the first sub-circuit design with configuration data that implement the RTP core, via execution of a run-time reconfiguration control program; and configuring the PLD with the configuration bitstream after replacement of the selected data under control of the run-time reconfiguration control program.

2. The method of claim 1, further comprising:

generating a netlist that consumes the selected subset of resources of the PLD; and instantiating in the main circuit design a template that references the netlist.

3. The method of claim 2, further comprising:
  determining interface requirements and PLD resource requirements of the RTP core;
  generating for the first sub-circuit design a first set of components that define an interface to the RTP core; and
  generating for the first sub-circuit design a second set of components that connect the interface components and that reserve the selected subset of resources of the PLD needed by the RTP core.

4. The method of claim 1, further comprising:
  for a set of sources and sinks outside the selected subset of resources and connected by a set of routing resources within the selected subset of resources, removing from the configuration bitstream configuration data for the set of routing resources, via execution of the run-time reconfiguration control program; and
  generating new configuration data that connects the set of sources and sinks using routing resources of the PLD outside the selected subset of resources.

5. The method of claim 1, wherein generating the configuration bitstream from the main circuit design comprises:
  synthesizing the main circuit design and forming a netlist file;
  mapping networks in the netlist file to resource objects of the PLD;
  placing the resource objects in association with resources of the PLD; and
  routing signals of the circuit design between selected resources.

6. The method of claim 1, wherein the PLD is an FPGA that includes a plurality of lookup tables, and further comprising:
  generating a netlist that specifies a selected configuration of shift registers for the sub-circuit design; and
  mapping the configuration of shift registers to lookup tables in the selected subset of PLD resources.

7. The method of claim 1, further comprising if run-time parameterization of the RTP core is not required and if the RTP core has been routed at design time, invoking the RTP core to write the RTP core configuration data to the configuration data.

8. The method of claim 7, wherein the selected subset of resources of the PLD define a reserved area, and if run-time parameterization of the RTP core is required, further comprising:
  designating as in-use routing resources, routing resources that are used within the reserved area; and
  invoking the RTP core when run-time parameters are available.

9. The method of claim 8, further comprising:
  generating a netlist that consumes the selected subset of resources of the PLD; and
  instantiating in the main circuit design a template that references the netlist.

10. The method of claim 9, further comprising:
  determining interface requirements and PLD resource requirements of the RTP core;
  generating for the first sub-circuit design a first set of components that define an interface to the RTP core; and
  generating for the first sub-circuit design a second set of components that connect the interface components and that reserve the selected subset of resources of the PLD needed by the RTP core.

11. The method of claim 10, further comprising:
  for a set of sources and sinks outside the selected subset of resources and connected by a set of routing resources within the selected subset of resources, removing from the configuration bitstream configuration data for the set of routing resources, via execution of the run-time reconfiguration control program; and
  generating new configuration data that connects the set of sources and sinks using routing resources of the PLD outside the selected subset of resources.

12. The method of claim 11, wherein generating the configuration bitstream from the main circuit design comprises:
  synthesizing the main circuit design and forming a netlist file;
  mapping networks in the netlist file to resource objects of the PLD;
  placing the resource objects in association with resources of the PLD; and
  routing signals of the circuit design between selected resources.

13. The method of claim 12, wherein the PLD is an FPGA that includes a plurality of lookup tables, and further comprising:
  generating a netlist that specifies a selected configuration of shift registers for the sub-circuit design; and
  mapping the configuration of shift registers to lookup tables in the selected subset of PLD resources.

14. An apparatus for implementing a circuit on a programmable logic device (PLD), from a circuit design defined by a high-level static circuit design and a run-time parameterizable (RTP) core, comprising:
  means for generating a configuration bitstream from a main circuit design specified in a hardware description language and including a first sub-circuit design that specifies a selected subset of resources of the PLD needed by the RTP core and an interface between the RTP core and other parts of the main circuit design;
  means for replacing in the configuration bitstream configuration data that correspond to the first sub-circuit design with configuration data that implement the RTP core, via execution of a run-time reconfiguration control program; and
  means for configuring the PLD with the configuration bitstream after replacement of the selected data.

* * * * *